(12) United States Patent
Kim et al.

(10) Patent No.: US 7,656,667 B2
(45) Date of Patent: Feb. 2, 2010

(54) PLASMA DISPLAY DEVICE

(75) Inventors: Jihoon Kim, Yongin-si (KR); Byoungjo Chang, Yongin-si (KR); Kyungwon Kang, Yongin-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 56 days.

(21) Appl. No.: 12/000,441

(22) Filed: Dec. 12, 2007

(65) Prior Publication Data

US 2008/0170359 A1  Jul. 17, 2008

(30) Foreign Application Priority Data

Jan. 17, 2007 (KR) .................. 10-2007-0005433

(51) Int. Cl.
*H05K 7/20* (2006.01)
*H01J 1/02* (2006.01)

(52) U.S. Cl. ................... 361/704; 361/681; 361/690; 361/719; 313/46

(58) Field of Classification Search .............. None
See application file for complete search history.

(56) References Cited

U.S. PATENT DOCUMENTS 7,365,807 B2 *  4/2008  Iwai ..................... 348/794
7,423,878 B2 *  9/2008  Kim ..................... 361/704
7,432,640 B2 * 10/2008  Kim et al. ............. 313/46
7,436,654 B2 * 10/2008  Cho ..................... 361/679.27
7,463,490 B2 * 12/2008  Kim et al. ............. 361/752
2005/0111175 A1 *  5/2005  Kim ..................... 361/681
2006/0268497 A1 * 11/2006  Shin .................... 361/681
2007/0109220 A1 *  5/2007  Jeong ................... 345/60

FOREIGN PATENT DOCUMENTS

JP  2006195177 A  *  7/2006
JP  2006235626 A  *  9/2006
KR  10-2006-0109678    10/2006

* cited by examiner

*Primary Examiner*—Boris L Chervinsky
(74) *Attorney, Agent, or Firm*—Robert E. Bushnell, Esq.

(57) ABSTRACT

A plasma display device that includes a plasma display panel adapted to display images on a front side thereof, a chassis base including conductive material and arranged behind the plasma display panel, a plurality of circuit boards adapted to drive the plasma display panel, the plurality of circuit boards being fixed on the chassis base with a gap between each of the plurality of circuit boards and the chassis base and a driving circuit portion including a plurality of cables and adapted to electrically connect the circuit boards, wherein the chassis base includes at least one holding unit that is adapted to hold the plurality of cables on one side of the chassis base. The holding unit being adapted to attenuate EMI before it reaches the cables within.

13 Claims, 4 Drawing Sheets

PLASMA DISPLAY DEVICE

CLAIM OF PRIORITY

This application makes reference to, incorporates the same herein, and claims all benefits accruing under 35 U.S.C. §119 from an application for PLASMA DISPLAY DEVICE earlier filed in the Korean Intellectual Property Office on 17 Jan. 2007 and there duly assigned Serial No. 10-2007-0005433.

BACKGROUND OF THE INVENTION

1. Field of the Invention

The present invention relates to a plasma display device, and more particularly, to a plasma display device including at least one holding unit attenuates the electromagnetic interference (EMI) generated in a driving circuit portion that drives a plasma display panel.

2. Description of the Related Art

In general, a plasma display device includes a plasma display panel that makes use of plasma generated as a result of gas discharge, a chassis base that supports the plasma display panel, and a driving circuit portion that is fixed on the chassis base and drives the plasma display panel. The plasma display panel includes two sheets of glass substrates facing each other, and the space internally formed between the glass substrates forms a discharge space having a plurality of electrodes. Each of the electrodes is applied with voltage that is supplied by the driving circuit portion, thereby displaying an image on the plasma display panel.

The chassis base is bonded to the plasma display panel by means of double-sided adhesive tape that is attached on the front side of the chassis base, while a plurality of circuit boards are fixed on the rear side of the chassis base. The circuit boards are usually fixed onto the chassis base by adjoining a bolt that passes through the binding holes formed in the circuit boards, to a boss installed on the chassis base. The chassis base is formed of a metallic material having a higher mechanical hardness than the plasma display panel, thus being capable of supporting the plasma display panel. The chassis base has excellent thermal conductivity, and thus plays a role of dissipating the heat generated by the plasma display panel. The chassis base is also formed of a material having good electric conductivity, and thus plays a role as a ground shield of EMI that is generated during the operation of the plasma display panel.

The driving circuit portion includes a plurality of circuit boards and a plurality of cables electrically connecting the circuit boards. Each of these circuit boards includes a plurality of driving circuit boards for controlling the electrodes formed on the plasma display panel, a buffer circuit board for intermediating the electrode drive of the driving circuit boards, a logic circuit board for generating control signals based on the image signals applied from an external source and transmitting the control signals to the driving circuit boards, and a power supply circuit board for supplying electric power to each of the circuit boards.

Among these, when a cable is installed alongside with a circuit board having high intensity signals, such as the power supply circuit board, the cable is vulnerably exposed to the EMI generated by the circuit board, and thus, there can be an occurrence of signal distortion or malfunction of the plasma display panel. Furthermore, if the cable is a power line, the EMI generated by the cable itself can affect the function of the circuit board, thereby causing a problem in product reliability of the plasma display device as a whole. What is needed is a design for a plasma display device that prevents EMI generated the plasma display device from disrupting the performance of other circuit elements located within the plasma display device.

SUMMARY OF THE INVENTION

It is an aim of the present invention to address the conventional problems of plasma display devices described above, and in particular, to provide a plasma display device that can attenuate or block EMI that is generated by a driving circuit portion and reduce signal distortion, by having at least one holding unit for holding cables that shields the cables from EMI produced elsewhere within the plasma display device, the cables electrically connecting circuit boards to other circuit boards disposed behind the plasma display panel.

According to an aspect of the present invention, there is provided a plasma display device that includes a plasma display panel adapted to display images on a front side thereof, a chassis base including conductive material and arranged behind the plasma display panel, a plurality of circuit boards adapted to drive the plasma display panel, the plurality of circuit boards being fixed on the chassis base with a gap between the plurality of circuit boards and the chassis base and a driving circuit portion including a plurality of cables adapted to electrically connect the circuit boards, wherein the chassis base includes at least one holding unit that is adapted to hold the plurality of cables on one side of the chassis base. The plasma display device can also include a heat sink sheet arranged between the plasma display panel and the chassis base.

The holding unit can include a tube protruding toward a direction where the circuit boards are fixed, and includes a pair of openings adapted to allow one of said plurality of cables to pass through. The holding unit can include a rectangular-shaped perpendicular cross-section. The holding unit can include two lateral sides, one of the two lateral sides being open. The holding unit can include a semicircular shaped perpendicular cross-section. The holding unit can include at least one fixing member adapted to fix the plurality of cables within. The fixing member can be bound to the holding unit on one end via a binding aperture arranged in the holding unit, the other end of the fixing member can include a nipper adapted to hold the cables together. The holding unit can be a trench arranged in a side of the chassis base facing the plasma display panel. The holding unit can be formed to penetrate the chassis base, and includes openings that respectively serve as an inlet and an outlet for the cables. The chassis base can be made out of either an aluminum (Al) alloy or an iron (Fe) alloy. Each of the plurality of circuit boards can be a board selected from the group consisting of a power supply circuit board, a driving circuit board, a logic circuit board and a buffer circuit board. The heat sink sheet can be made out of a material based on conductive carbon fiber. The holding unit and the chassis base can be integral with each other. The holding unit can be adapted to prevent electromagnetic interference (EMI) from the plurality of circuit boards from reaching the plurality of cables within the holding unit and can be adapted to prevent EMI generated by the plurality of cables within from reaching the plurality of circuit boards. The holding unit can be made out of an aluminum (Al) alloy or an iron (Fe) alloy.

BRIEF DESCRIPTION OF THE DRAWINGS

A more complete appreciation of the invention and many of the attendant advantages thereof, will be readily apparent as the same becomes better understood by reference to the following detailed description when considered in conjunction with the accompanying drawings in that like reference symbols indicate the same or similar components, wherein.

DETAILED DESCRIPTION OF THE INVENTION

Figure 1:
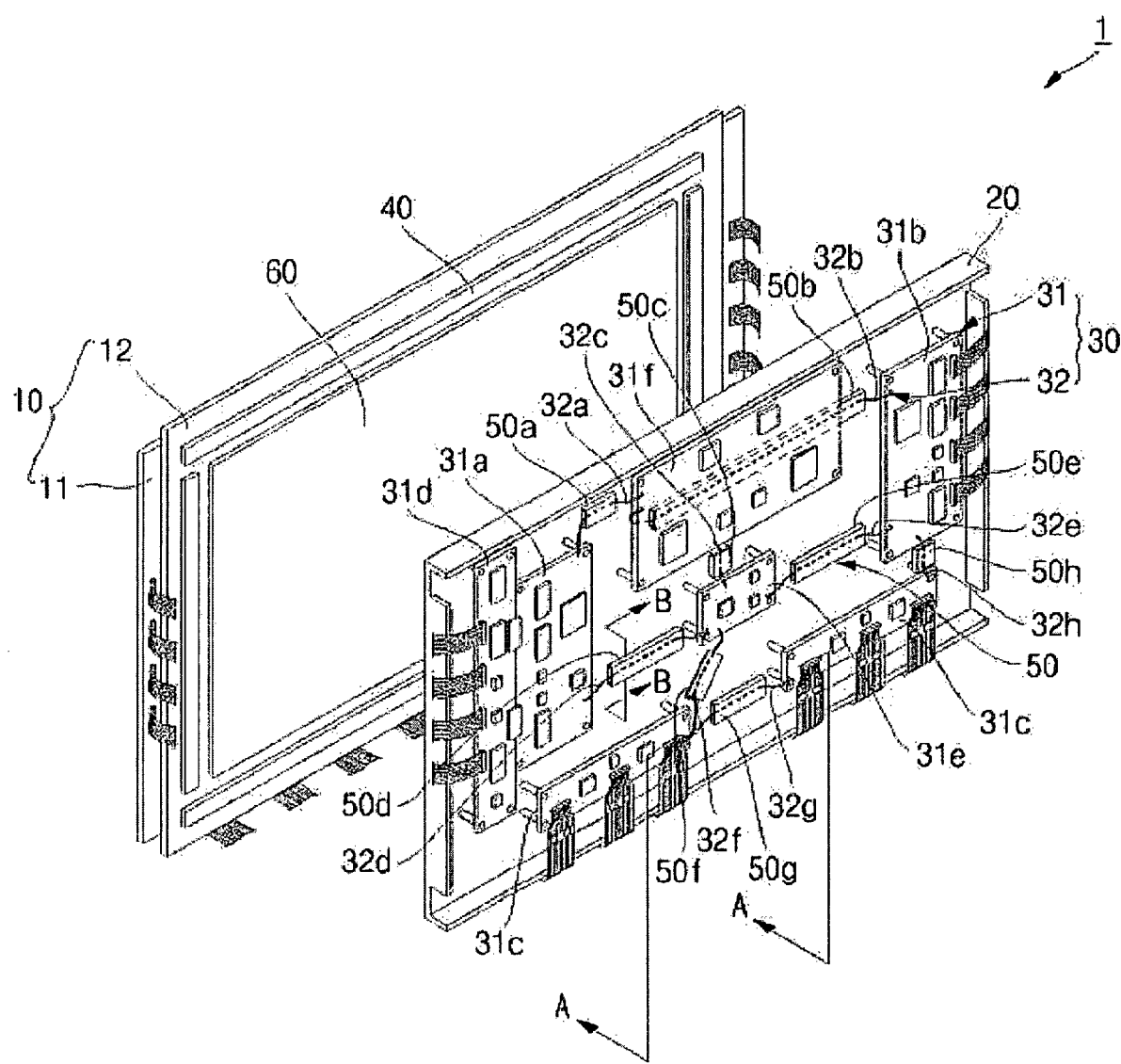
FIG. 1 is a perspective view of a plasma display device according to the first embodiment of the present invention.
Figure 2:
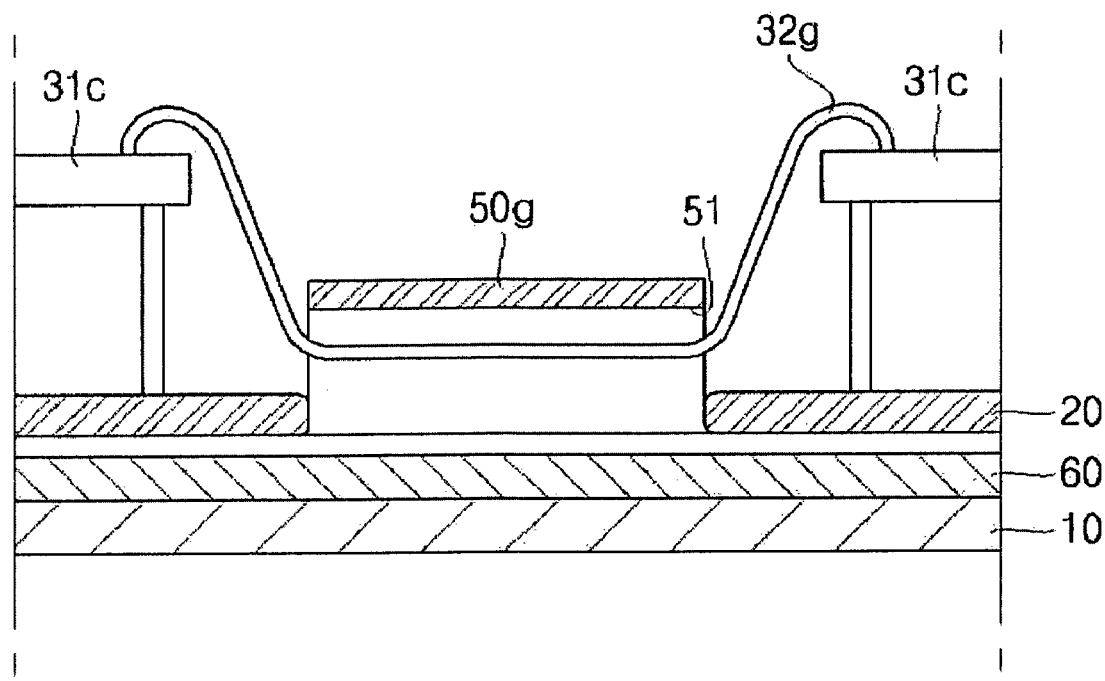
FIG. 2 is a cross-sectional view of the portion of the plasma display device cut along the line A-A' of FIG. 1.
Figure 3:
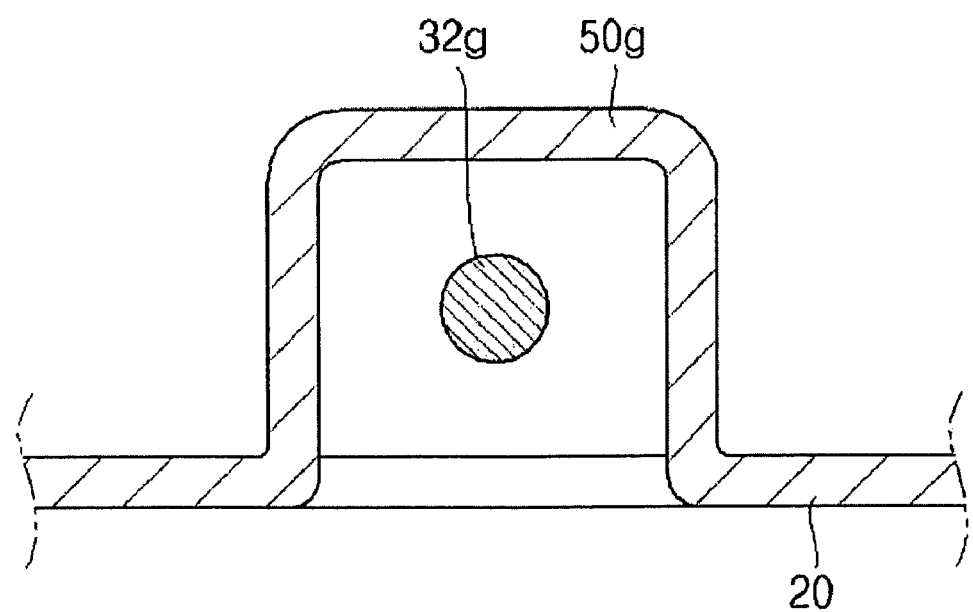
FIG. 3 is a perpendicular cross-sectional view of the portion of the plasma display device cut along the line B-B' of FIG. 1.

Turning now to FIGS. 1 through 3, FIG. 1 is a perspective view schematically illustrating a plasma display device 1 according to the first embodiment of the present invention, FIG. 2 is a diagram illustrating the holding unit holding cables, shown as the portion cut along the line A-A' of FIG. 1 and FIG. 3 is a view taken along B-B' of FIG. 1. Referring to FIGS. 1 through 3, the plasma display device 1 according to the first embodiment of the present invention includes a plasma display panel 10 that displays an image by means of gas discharge, a chassis base 20 that is disposed behind the plasma display panel 10, a driving circuit portion 30 including a plurality of circuit boards 31a, 31b, 31c, 31d, 31e and 31f, that are fixed on the side of the chassis base 20 that is opposite to the side facing the plasma display panel 10, with a gap separating the circuit boards from the chassis base 20, and a plurality of cables 32a, 32b, 32c, 32d, 32e, 32f, 32g and 32h, electrically connecting the circuit boards 31a, 31b, 31c, 31d, 31e, 31f, and a plurality of holding units 50a, 50b, 50c, 50d, 50e, 50f, 50g and 50h, that are formed on one side of the chassis base 20 to hold at least a part of the cables 32a, 32b, 32c, 32d, 32e, 32f, 32g and 32h. The plasma display device 1 can be also formed to include a heat sink sheet 60 interposed between the plasma display panel 10 and the chassis base 20.

Hereinafter, the plurality of circuit boards 31a, 31b, 31c, 31d, 31e and 31f will be collectively referred to as circuit boards 31. Furthermore, the plurality of cables 32a, 32b, 32c, 32d, 32e, 32f and 32g will be collectively referred to as cables 32. Also, the plurality of holding units 50a, 50b, 50c, 50d, 50e, 50f and 50g will be collectively referred to holding unit 50.

The plasma display panel 10 includes a front panel 11 and a rear panel 12, and discharge cells (not shown in the figures) between the front panel 11 and the rear panel 12, and the plasma display device 10 being attached on the front side of the chassis base 20 by means of an adhesive bonding material such as double-sided adhesive tape 40 or an equivalent. More particularly, the plasma display panel 10 includes discharge cells containing a discharge gas, a phosphor coated on the inner surfaces of the discharge cells and electrodes to which voltage are applied. The operation of the plasma display panel 10 as such is initiated by signals transmitted from the driving circuit portion 30 that is connected to the electrodes, the plasma display panel 10 subsequently generating plasma discharge, and ultraviolet radiation generated as a result of the plasma discharge exciting the phosphor to emit visible light, thereby producing a visible image.

The driving circuit portion 30 includes a plurality of circuit boards 31 including driving circuits, and a plurality of cables 32 electrically connecting the circuit boards 31. These circuit boards 31 are fixed on the chassis base 20 on the side that is opposite to the side of the chassis base 20 facing the plasma display panel 10. The plurality of circuit boards 31 can be specifically divided into a plurality of driving circuit boards 31a, 31b and 31c controlling the electrodes formed inside the plasma display panel 10; a buffer circuit board 31d mediating the electrode drive of a driving circuit boards 31a, 31b and 31c; a logic circuit board 31e generating control signals based on the image signals applied from an external source and transmitting the control signals to the driving circuit boards 31a, 31b and 31c; and a power supply circuit board 31f supplying the power to each of the circuit boards described above.

The cables 32 are connections between the circuit boards 31, including power lines transmitting electric power and signal lines transmitting data related to the drive of the circuit boards, to each of the circuit boards 31. These cables 32 can be formed to have various thicknesses depending on the type of the circuit board 31 to be connected. The cables 32 can also be in the form of a bundle of multiple strands, but the present invention is not limited thereto.

The chassis base 20 takes the role of fixing the circuit boards 31 while supporting the plasma display panel 10, and the role of grounding EMI. Thus, the chassis base 20 can be formed of an aluminum (Al) alloy or an iron (Fe) alloy, that has good electric conductivity accompanied by high hardness. However, the material of the chassis base 20 that can be used for the present invention is not limited thereto, and the chassis base 20 can be formed of a variety of metal materials having both electric conductivity and hardness. The chassis base 20 is formed integrally with at least one holding unit 50 that can hold at least a part of the cables 32.

The holding unit 50 is formed integrally with the chassis base 20 in the form of a tube protruding from the chassis base 20 toward the direction where the circuit boards 31 are fixed. The holding unit 50 is formed by a press processing method. The holding unit 50 is formed to have openings 51 that serve as an inlet and an outlet for the cables 32, on both ends of the tube. The holding unit 50 can have a plurality of openings 51 at various locations, if necessary, with each opening having a circular or a rectangular shape. The openings 51 can be formed by punching after the holding unit 50 has been formed, or can be simultaneously formed together with the holding unit 50 during the press processing.

The holding unit 50 can be selectively formed along the paths of wiring of the cables 32, and in this case, the perpendicular cross-section of a holding unit can be rectangular in shape. Such shape can have a relatively large volume within a limited space, and thus is advantageous in holding a large number of cables or relatively thick cables.

The heat sink sheet 60 serves to transfer heat generated in the plasma display panel 10 to the chassis base 20, so that the heat can be dissipated out. The heat sink sheet 60 also helps in grounding the EMI generated by circuit boards mounted on the chassis base 20, as at least a portion of the heat sink sheet 60 is connected to the chassis base 20. The heat sink sheet 60 can be formed of a material based on conductive carbon fiber.

However, the material of the heat sink sheet 60 that can be used for the present invention is not limited thereto, and the heat sink sheet 60 can be formed of a variety of materials having good electric conductivity and thermal conductivity.

According to the first embodiment of the present invention as described above, the chassis base 20 has at least one holding unit 50 that is integrally formed with the chassis base 20 and holds cables 32, so that the appearance of the plasma display device 1 can be enhanced when the cables 32 are neatly held by the holding unit 50. Furthermore, since the holding unit 50 is formed on the chassis base 20 along the predetermined paths of wiring of the cables 32 prior to the assembly of the driving circuit portion 30, wiring of the cables 32 can be efficiently carried out. The cables 32 held in the holding unit 50 as described above are also protected by the holding unit 50 from being pressed by a pressing instrument during the process of assembling the plasma display device 1, or from being damaged by an external factor.

The holding unit 50 is formed to envelop the cables 32, and thus can effectively attenuate the EMI generated by the driving circuit portion 30. The holding unit 50 holds the cables 32 such that the cables 32 transmitting electric signals are prevented from being affected by the EMI generated by the circuit boards 31, that can cause signal distortion. Furthermore, the holding unit 50 also protects the driving circuit portion 30 in the vicinity of the cables 32 including power lines, by attenuating or blocking the EMI generated by the cables 32 themselves.

Since the plasma display device 1 optionally contains a heat sink sheet 60, and in this case, the heat sink sheet 60 is formed of a material that can absorb EMI, the EMI generated by the cables 32 and emanating in a direction towards the plasma display panel 10 can be attenuated or blocked by the heat sink sheet 60. This structure can attenuate EMI more effectively. The plasma display device 1 constructed as such can prevent the malfunction of the plasma display panel 10 due to the signal distortion caused by the EMI generated in the driving circuit portion 30, and thus attain improved product reliability.

Figure 4:
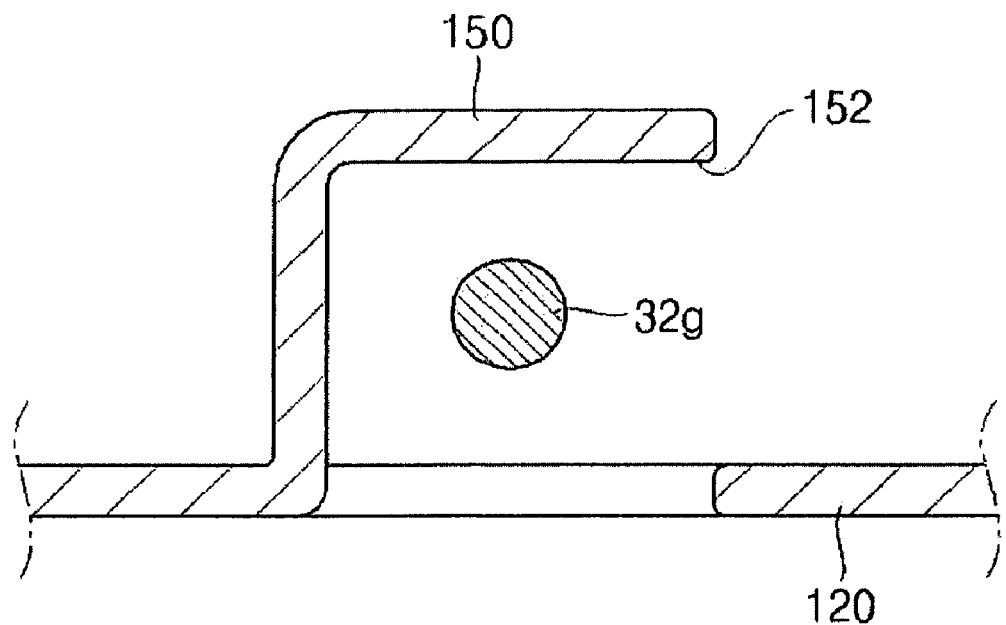
FIG. 4 is a perpendicular cross-sectional view of a portion of a plasma display device according to the second embodiment of the present invention, depicting the portion corresponding to the portion shown in FIG. 3.

Next, a plasma display device according to a second embodiment of the present invention will be described in conjunction with FIG. 4. FIG. 4 is a perpendicular cross-sectional view of a portion of a plasma display device according to the second embodiment of the present invention, illustrating the portion corresponding to the portion shown in FIG. 3 focusing on a cross section of a holding unit. The plasma display device according to the second embodiment of the present invention is identical or similar to the plasma display device 1 according to the first embodiment as shown in FIGS. 1 through 3 in most regards. Thus, the following description will be focused on the parts of the configuration of the second embodiment that are different from the corresponding parts in the first embodiment.

Referring to FIG. 4, in the plasma display device according to the second embodiment of the present invention, a holding unit 150 is formed in a rectangular shape in that any one of the two lateral sides of the perpendicular cross-section is open. Thus, the holding unit 150 can have a lateral-side opening 152. The lateral-side opening 152 serves as an inlet as well as an outlet for the cables 32. Accordingly, the trouble of forming openings at a number of sites can be eliminated, and there is an advantage that the holding unit 150 thus shaped helps in shortening the time required for the design and processing of the device. However, if necessary, it is also possible to form more openings on the side facing the lateral-side opening 152 in the holding unit 150. In this case, the openings can be formed to have either a circular shape or a rectangular shape.

Figure 5:
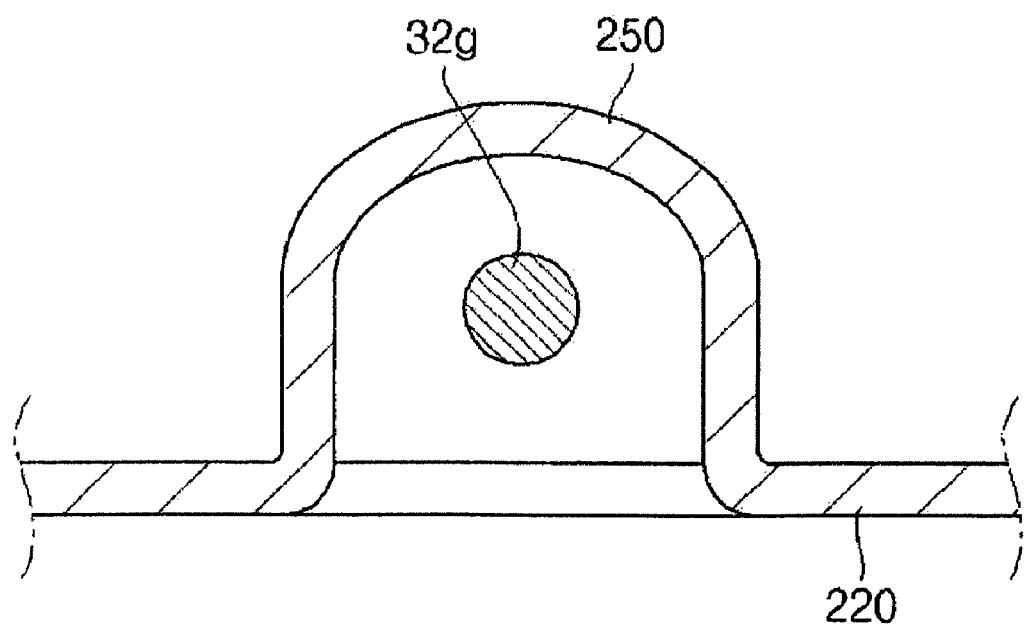
FIG. 5 is a perpendicular cross-sectional view of a portion of a plasma display device according to the third embodiment of the present invention, depicting the portion corresponding to the portion shown in FIG. 3.

Next, a plasma display device according to a third embodiment of the present invention will be described in conjunction with FIG. 5. FIG. 5 is a perpendicular cross-sectional view of a portion of a plasma display device according to the third embodiment of the present invention, illustrating the portion corresponding to the portion shown in FIG. 3 focusing on a cross section of a holding unit. Since the plasma display device according to the third embodiment of the present invention is identical or similar to the plasma display device according to the first embodiment as shown in FIGS. 1 through 3 in most regards, the following description will be focused on the parts of the configuration that are different from the corresponding parts in the first embodiment.

Referring to FIG. 5, in the plasma display device according to the third embodiment of the present invention, a holding unit 250 is formed to have a semicircular-shaped perpendicular cross-section. The holding unit 250 is formed to have a relatively lower height of the protrusion toward the direction of the circuit boards than that of FIGS. 3 and 4, making the process of installing circuit boards much easier. The holding unit 250 has a smaller volume compared with the rectangular-shaped holding unit 50 of the first embodiment of the present invention, and accordingly, it is advantageous in the case of holding relatively thinner cables. Furthermore, since the holding unit 250 is formed in a circular shape corresponding to the shape of a cable, the holding unit 250 can more efficiently attenuate the EMI generated in the driving circuit portion 30.

Figure 6:
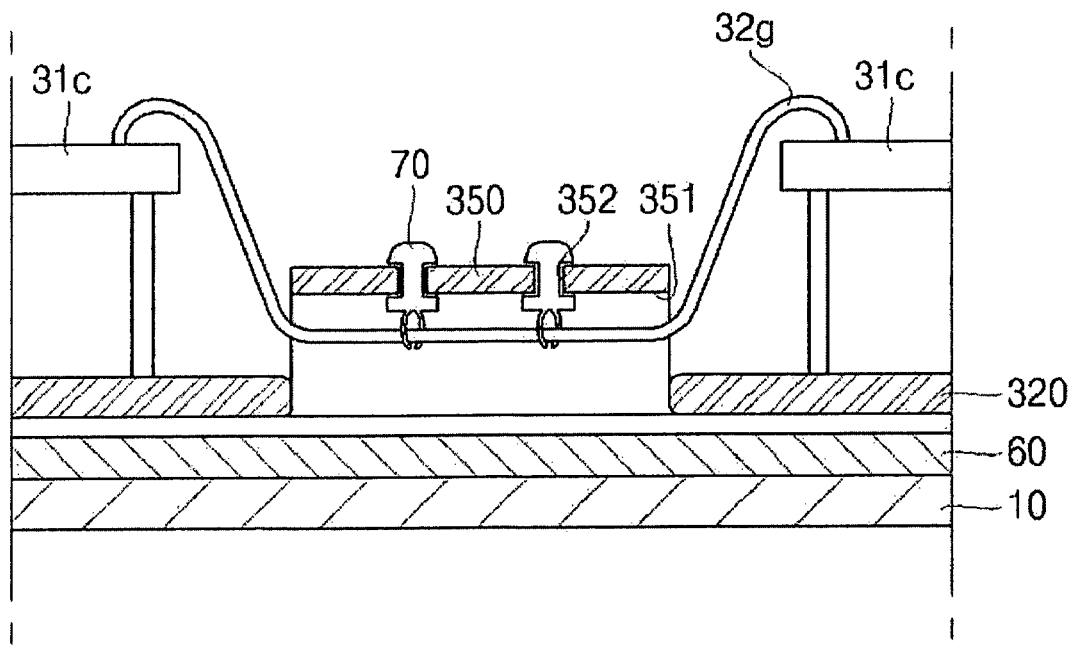
FIG. 6 is a cross-sectional view of a portion of a plasma display device according to the fourth embodiment of the present invention, depicting the form of the holding unit holding cables.

Next, a plasma display device according to a fourth embodiment of the present invention will be described. FIG. 6 is a cross-sectional view of a portion of a plasma display device according to the fourth embodiment of the present invention, depicting the form of the holding unit holding cables. Since the plasma display device according to the fourth embodiment of the present invention is identical or similar to the plasma display device according to the first embodiment as shown in FIGS. 1 through 3 in most regards, the following description will be focused on the parts of the configuration that are different from the corresponding parts in the first embodiment. Meanwhile, the fourth embodiment of the present invention is also applicable to the second or third embodiments described above.

Referring to FIG. 6, in the plasma display device according to the fourth embodiment of the present invention, a holding unit 350 includes a number of separate fixing members 70 to fix the cables 32 within. The fixing member 70 is bound to the holding unit 350 at one end via a binding hole 352 formed in the holding unit 350, while having the other end in the form of a nipper to hold cables together. The fixing member 70 can instead be formed into a simple ring shape, instead of the nipper form, to hold cables together. However, the form of the fixing member 70 that can be used for the present invention is not limited thereto, and the fixing member 70 can be formed into a variety of shapes that can hold cables together. One or more fixing members 70 can be installed within a holding unit 350 to serve to prevent cables from breaking away from the holding unit 350. The holding unit 350 includes openings 351 that serve as an inlet and an outlet for the cables 32. According to the current embodiment of the present invention, the chassis base 320 and the holding unit 350 are formed integrally and cannot be separated from each other. Thus, when the cables 32 are held in the holding unit 350, the holding unit 350 can absorb the EMI generated by the cables 32, or prevent the cables 32 from being exposed to the EMI generated by the circuit boards 31. Thus, the amount of generated EMI that reaches another circuit component within the display device is reduced, and the product reliability of the plasma display device is improved.

Figure 7:
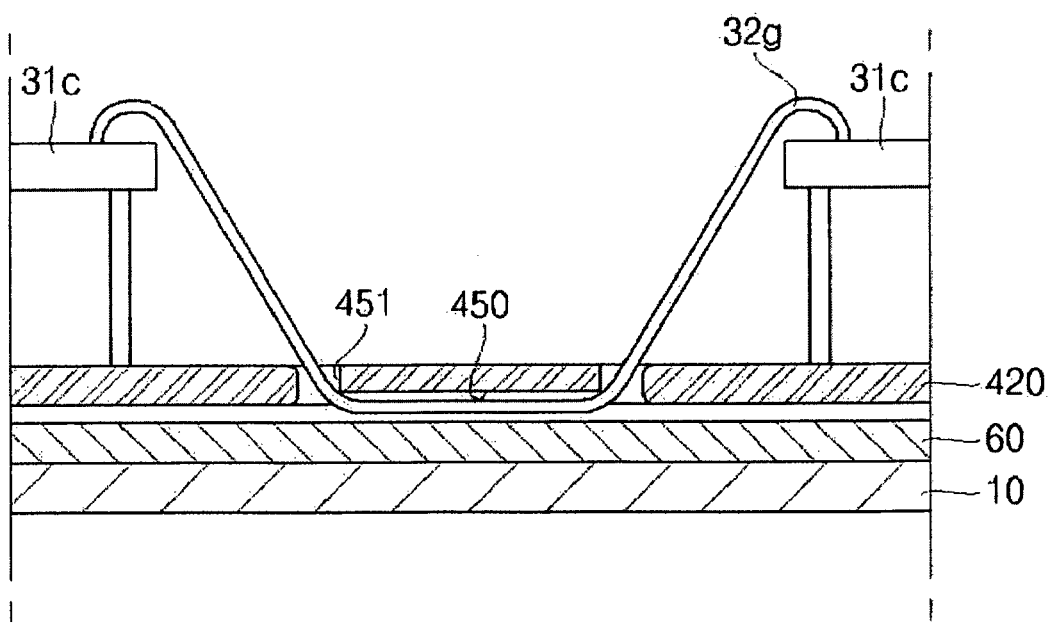
FIG. 7 is a cross-sectional view of a portion of a plasma display device according to the fifth embodiment of the present invention, depicting the holding unit holding cables.

Next, a plasma display device according to a fifth embodiment of the present invention will now be described in conjunction with FIG. 7. FIG. 7 is a cross-sectional view of a portion of a plasma display device according to the fifth embodiment of the present invention, depicting the form of the holding unit holding cables. The plasma display device according to the fifth embodiment of the present invention is identical or similar to the plasma display device according to the first embodiment as shown in FIGS. 1 through 3 in most regards. Thus, the following description will be focused on the parts of the configuration that are different from the corresponding parts in the first embodiment.

Referring to FIG. 7, in the plasma display device according to the fifth embodiment of the present invention, a holding unit 450 is formed such that the side of the chassis base 420 facing the circuit boards 31 is flat, while the other side of the chassis base 420 facing the plasma display panel 10 is formed in the shape of a trench to hold the cables 32. The holding unit 450 can be formed by a press processing method. The holding unit 450 has openings 451 that are formed to penetrate vertically through the chassis base 420 at the two lateral edges or at any site where required. The openings 451 can be formed to have a circular or rectangular shaped cross-section. The cables 32 are held to be interposed between the trench-shaped holding unit 450 and the heat sink sheet 60, and enter the holding unit 450 through the openings 451. Since the holding unit 450 is flat in shape, it is preferable for such holding unit to hold cables that are wide and flat in shape, or cables that are thinner than the thickness of the chassis base 420. The holding unit 450 also reduces the amount of EMI generated in the driving circuit portion 30 that receives the cables on the basis of the same principle applied in other embodiments of the present invention. The chassis base 420 is formed to have a flat rear side while still including the holding unit 450, and is advantageous in that circuit boards can be relatively efficiently installed.

As described above, the present invention has been described with reference to the specific preferred embodiments described above, but the present invention is not intended to be limited thereto. Rather, it should be understood that various modifications and variations of the present invention can be made by those skilled in the art without departing from the spirit and the technical scope of the present invention as defined by the appended claims.

As described above, the plasma display device according to the present invention is useful in achieving efficient wiring by holding cables in at least one holding unit that is formed integrally with the chassis base, and has an effect of enhancing the appearance of the plasma display device. Furthermore, the holding unit according to the present invention attenuates the EMI generated by circuit boards from affecting the electric signals transmitted by the cables, or absorbs the EMI generated by the cables themselves, thereby reducing the overall EMI generated in the driving circuit portion and improving the reliability of the plasma display device. In addition, the holding unit according to the present invention has an effect of protecting the cables from being damaged during the process of assembling the plasma display device.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A plasma display device, comprising:
   a plasma display panel adapted to display images on a front side thereof;
   a chassis base including conductive material and arranged behind the plasma display panel;
   a plurality of circuit boards adapted to drive the plasma display panel, the plurality of circuit boards being fixed on the chassis base with a gap between each of the plurality of circuit boards and the chassis base; and
   a driving circuit portion including a plurality of cables and adapted to electrically connect the circuit boards, wherein the chassis base includes at least one holding unit that is adapted to hold the plurality of cables on one side of the chassis base, wherein the holding unit is a trench arranged in a side of the chassis base facing the plasma display panel.

2. The plasma display device of claim 1, wherein the holding unit penetrates the chassis base and includes openings that respectively adapted to serve as an inlet and an outlet for ones of the plurality of cables.

3. The plasma display device of claim 1, wherein the chassis base comprises a material selected from a group consisting of aluminum (Al) alloys and iron (Fe) alloys.

4. The plasma display device of claim 1, wherein ones of the plurality of circuit boards being a board selected from the group consisting of a power supply circuit board, a driving circuit board, a logic circuit board and a buffer circuit board.

5. The plasma display device of claim 1, further comprising a heat sink sheet arranged between the plasma display panel and the chassis base.

6. The plasma display device of claim 5, wherein the heat sink sheet is comprised of a material based on conductive carbon fiber.

7. The plasma display device of claim 1, the holding unit being adapted to prevent electromagnetic interference (EMI) from the plurality of circuit boards from reaching the plurality of cables within the holding unit and being adapted to prevent EMI generated by the plurality of cables within from reaching the plurality of circuit boards.

8. The plasma display device of claim 1, wherein the holding unit and the chassis base are integral with each other.

9. The plasma display device of claim 1, the holding unit being comprised of a material selected from a group consisting of aluminum (Al) alloys and iron (Fe) alloys.

10. The plasma display device of claim 1, the trench providing a space between the chassis base and the plasma display panel, one of said plurality of cables being run through said space.

11. The plasma display device of claim 1, the chassis base being perforated by apertures at each end of said trench, wherein one of said plurality of cables running through said apertures and in a space between said trench of said chassis base and said plasma display panel.

12. The plasma display device of claim 5, wherein the heat sink sheet is comprised of a material that can absorb electromagnetic interference (EMI).

13. The plasma display device of claim 12, the chassis base being perforated by apertures at each end of said trench, wherein one of said plurality of cables runs through said apertures and in a space between said trench of said chassis base and said heat sink sheet.

* * * * *